US010056178B2

(12) United States Patent
Miyazoe et al.

(10) Patent No.: US 10,056,178 B2
(45) Date of Patent: Aug. 21, 2018

(54) SUPERCONDUCTING MAGNET DEVICE

(71) Applicant: Hitachi, Ltd., Tokyo (JP)

(72) Inventors: Akihisa Miyazoe, Tokyo (JP); Takeshi Nakayama, Tokyo (JP); Manabu Aoki, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 231 days.

(21) Appl. No.: 15/111,620

(22) PCT Filed: Jan. 27, 2014

(86) PCT No.: PCT/JP2014/051601
§ 371 (c)(1),
(2) Date: Jul. 14, 2016

(87) PCT Pub. No.: WO2015/111201
PCT Pub. Date: Jul. 30, 2015

(65) Prior Publication Data
US 2016/0343491 A1    Nov. 24, 2016

(51) Int. Cl.
*H01F 6/00* (2006.01)
*G01R 33/3815* (2006.01)
(Continued)

(52) U.S. Cl.
CPC ......... *H01F 6/008* (2013.01); *G01R 33/3815* (2013.01); *H01F 6/04* (2013.01); *H01F 6/06* (2013.01); *F17C 2250/0443* (2013.01)

(58) Field of Classification Search
CPC .................. H01F 6/00–6/065; G01R 33/3815
See application file for complete search history.

(56) References Cited

U.S. PATENT DOCUMENTS

| 4,807,084 A * | 2/1989 | Takechi | H01F 6/006 335/216 |
| 2002/0017970 A1* | 2/2002 | Kinder | H01F 6/006 335/299 |

(Continued)

FOREIGN PATENT DOCUMENTS

| JP | 2012-023168 A | 2/2012 |
| JP | 2012-209381 A | 10/2012 |

OTHER PUBLICATIONS

International Search Report of PCT/JP2014/051601 dated Jun. 10, 2014.

*Primary Examiner* — Thienvu Tran
*Assistant Examiner* — Christopher Clark
(74) *Attorney, Agent, or Firm* — Mattingly & Malur, PC

(57) ABSTRACT

The superconducting magnet device reduces the number of connections within and/or the number of wires leading out of a superconducting coil winding and promptly starts expending the magnetic energy in a superconducting coil operating in a persistent-current mode when the superconducting coil increases in temperature or transitions to normal conductivity. This invention provides a superconducting magnet device that has the following: a superconducting coil connected to an excitation power supply; a persistent-current switch connected to the superconducting coil; a heater that controls the temperature of the persistent-current switch; a current source that is connected in parallel with the persistent-current switch and has a different polarity from the excitation power supply; a driving circuit connected to the heater and the current source; and a signal-inputting means for inputting a signal to the driving circuit. The driving circuit operates the heater and the current source when the signal is inputted thereto.

6 Claims, 3 Drawing Sheets

(51) Int. Cl.
*H01F 6/04* (2006.01)
*H01F 6/06* (2006.01)

(56) References Cited

U.S. PATENT DOCUMENTS

| | | | | |
|---|---|---|---|---|
| 2007/0024404 A1* | 2/2007 | Westphal | ................. | H01F 6/00 335/216 |
| 2010/0001821 A1* | 1/2010 | Diederichs | ............. | H01F 6/008 335/216 |
| 2012/0014030 A1* | 1/2012 | Ichiki | ....................... | H01F 6/02 361/141 |
| 2013/0234815 A1* | 9/2013 | Milward | .................. | H01F 6/00 335/216 |
| 2015/0255977 A1* | 9/2015 | Jonas | ................ | G01R 33/3815 361/19 |
| 2015/0270045 A1* | 9/2015 | Nakayama | ............... | H01F 6/04 505/211 |
| 2015/0323626 A1* | 11/2015 | Jonas | ................ | G01R 33/3804 324/322 |
| 2016/0308110 A1* | 10/2016 | Tanaka | ................... | H01L 39/20 |

* cited by examiner

SUPERCONDUCTING MAGNET DEVICE

TECHNICAL FIELD

The present invention relates to a superconducting magnet device.

BACKGROUND ART

In the present technical field, a technology disclosed in Patent Document 1 is available as a technology for reducing the possibility of damage by quenching or the like to a superconducting coil utilized in a superconducting magnet device. The document describes: "In order to provide a superconducting coil, a superconducting magnet and an operating method of the same which can prevent, in a superconducting magnet which is operating in a persistent current mode, burnout by a local temperature rise, a superconducting coil is provided wherein a plurality of superconducting wires are bundled as parallel conductors and the parallel conductors are wound into a coil and to which a supply source of current which reciprocates between the superconducting wires of the parallel conductors when quenching occurs is connected." Further, Patent Document 2 is available. The document describes: "In order to suppress a temperature rise of a superconducting coil even when a cryocooler is abnormal, a superconducting magnet device is provided which includes a superconducting coil, a cryocooler configured to cool the superconducting coil through a heat transfer path to the superconducting coil, a vacuum vessel configured to accommodate the superconducting coil and the cryocooler therein, and a detection device configured to detect whether the cryocooler is in a steady operation state or in an abnormal state and form, when the steady operation state is detected, a transmission path but place, when the abnormal state is detected, the superconducting coil and the cryocooler into an adiabatic state from each other."

PRIOR ART DOCUMENTS

Patent Documents

Patent Document 1: JP-2012-023168-A
Patent Document 2: JP-2012-209381-A

SUMMARY OF THE INVENTION

Problems to be Solved by the Invention

However, if it is tried to bundle a plurality of superconducting wires into parallel conductors and work the parallel conductors into a coil, then in the case of a high-temperature superconducting coil, a characteristic of the same is sometimes deteriorated by distortion caused by wiring lines in the winding. For example, if a bismuth-based superconducting wire which is one of high-temperature superconducting wires takes a strain of 0.3% or more, then there is the possibility that a coil performance may degrade. Therefore, there is the possibility that disposition of a line by connection of solder in the winding may deteriorate the high-temperature superconducting coil by distortion caused by the line at the connection position.

Further, upon normal conducting transition upon temperature rise of a superconducting coil by disorder of the cryocooler or by increase of the heat transfer resistance between the cryocooler and the superconducting coil, it is necessary to quickly expend magnetic energy in the superconducting coil. In the superconducting coil which operates in a persistent current mode, expenditure of the magnetic energy starts after a persistent current switch is heated by a heater until the persistent current switch transits to a normal conducting state. However, the persistent current switch which uses a high-temperature superconducting conductor has the large heat capacity. The property causes a long time to the transition to a normal conducting state and a delay of the magnetic energy reduction.

It is an object of the present invention to provide a superconducting magnet device wherein connection in a superconducting coil winding or taking out of a line is reduced and, upon temperature rise or normal conducting transition of a superconducting coil which operates in a persistent current mode, magnetic energy reduction of the superconducting coil is started quickly.

Means for Solving the Problems

In order to solve the subject described above, for example, a configuration described in the claim is adopted.

Although the present application includes a plurality of means for solving the subject described above, if an example of the same is raised, then a superconducting magnet device is configured such that it includes a superconducting coil connected to a power supply for excitation; a persistent current switch connected to the superconducting coil; a heater configured to control a temperature of the persistent current switch; a current source connected in parallel to the persistent current switch and having a polarity different from that of the power supply for excitation; a driving circuit connected to the heater and the current source; and signal inputting means for inputting a signal to the driving circuit; and that the driving circuit renders the heater and the current source operative when the signal is inputted thereto.

Effect of the Invention

With the present invention, a superconducting magnet device in which starting of magnetic energy reduction of the superconducting coil can be hastened can be provided.

MODE FOR CARRYING OUT THE INVENTION

Figure 1:
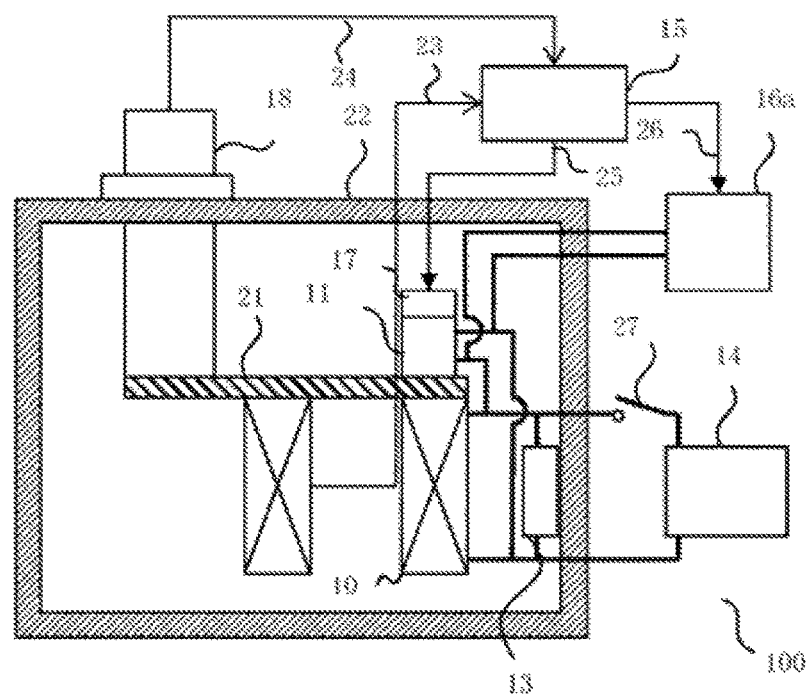
FIG. 1 is a block diagram of a superconducting magnet device according to embodiment 1 of the present invention.

In the following, embodiments are described with reference to the drawings. It is to be noted that, in the figures, a common element is denoted by the same reference character, and an overlapping description is omitted.

Embodiment 1

In the present embodiment, an example of a conduction cooling type superconducting magnet device 100 (hereinafter referred to as superconducting magnet device 100) is described.

FIG. 1 is an example of a block diagram of the superconducting magnet device 100 of the present embodiment. In the following, a configuration of the superconducting magnet device 100 of the present embodiment is described.

As depicted in FIG. 1, the superconducting magnet device 100 of the present embodiment includes a persistent current switch 11 to which a pulse power supply 16a is connected.

The superconducting magnet device 100 includes, as components thereof, an adiabatic vacuum vessel 22, a superconducting coil 10 (inductance: L) and the persistent current switch 11 accommodated in the adiabatic vacuum vessel 22, and a cryocooler 18 for cooling the persistent current switch 11. It is to be noted that the persistent current switch 11 is connected to the cryocooler 18 through a good conductor 21, and the superconducting magnet device 100 of the present embodiment is a device which adopts a conduction cooling system. The superconducting coil 10 is connected in parallel to the persistent current switch 11 and a protection circuit 13 (resistance: R). The superconducting coil 10 is, for example, a high-temperature superconducting coil formed by winding a high-temperature superconducting wire. The persistent current switch 11 is, for example, a superconducting thin film or a superconducting wire which is wound by non-inductive winding. The cryocooler 18 can be formed utilizing a known cryocooler such as, for example, a Gifford McMahon (GM) cryocooler.

Now, a technique for causing the superconducting magnet device 100 to transit to a persistent current operation mode.

When the superconducting coil 10 is to be excited, a switch 27 is closed. A power supply 14 for excitation and the superconducting coil 10 form a closed circuit. At this time, current is supplied from the power supply 14 for excitation to the superconducting coil 10, and the superconducting coil 10 accumulates magnetic energy. Until current supplied from the power supply 14 for excitation to the superconducting coil 10 increases until the superconducting coil 10 generates a predetermined magnetic field, the persistent current switch 11 is kept in a normal conducting state by heat generation of a heater 17 attached thereto.

After the current flowing through the superconducting coil 10 reaches current necessary to generate a predetermined magnetic field, namely, to rated current $I_{op}$, the heat generation of the heater 17 is set to 0 W. Meanwhile, since the persistent current switch 11 is connected to the cryocooler 18 through the good conductor 21, it is cooled by action of the cryocooler 18 and transits to a superconducting state. By causing the persistent current switch 11 to transit to a superconducting state and decreasing the current to be supplied from the power supply 14 for excitation, the current circulates in the closed loop formed from the superconducting coil 10 and the persistent current switch 11, and the superconducting magnet device 100 operates in a persistent current mode.

Now, a configuration and a process for causing the superconducting magnet device, which operates in a persistent current mode, to stop when some abnormality occurs are described.

Figure 2:
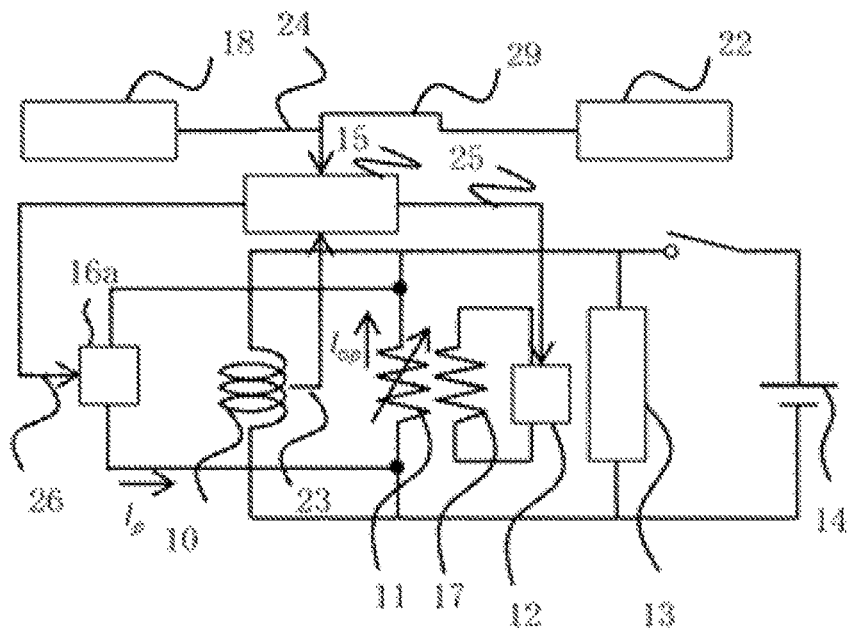
FIG. 2 is a circuit diagram of the superconducting magnet device according to embodiment 1 of the present invention.

FIG. 2 depicts an example of an equivalent circuit diagram of the superconducting magnet device 100 when the persistent current switch 11 in the present embodiment enters a superconducting state and the superconducting magnet device 100 operates in a persistent current mode.

In the present embodiment, the persistent current switch driving circuit 15 (hereinafter referred to as driving circuit 15) configured, for example, from a relay circuit is connected to a heater power supply 12 by a signal line 25 and is connected to the pulse power supply 16a by another signal line 26. The driving circuit 15 controls the heater power supply 12 and the pulse power supply 16a through the signal lines.

Further, the signal lines 23, 24 and 29 are connected to the driving circuit 15, and the driving circuit 15 is controlled by signals transmitted through the signal lines. The signal line 23 transmits a signal which indicates a temperature of the superconducting coil 10 or a generated voltage by normal conducting transition therethrough. The generated voltage can be detected by a balance voltage method or the like. Meanwhile, the signal line 23 is connected to a thermometer attached to the superconducting coil 10 or a voltage terminal of the superconducting coil 10. As the thermometer, for example, a resistance thermometer, a thermocouple and so forth are available. The signal line 24 transmits a signal representative of a normal or abnormal state of operation of the cryocooler 18 therethrough and is connected to the cryocooler 18. The signal line 29 transmits a signal indicative of a degree of vacuum of the adiabatic vacuum vessel 22 therethrough. For example, the signal line 29 is connected to a vacuum gauge attached to the adiabatic vacuum vessel 22.

Additionally, a signal line for detecting an event in response to which the superconducting magnet device 100 is to be emergently stopped, for example, power failure, may be connected. The driving circuit 15 may detect an abnormal event in response to which the superconducting magnet device 100 is to be stopped by a sensor or the like and may be driven using a result of the detection as an input signal thereto. Further, although a particular example of abnormality detection means for detecting such abnormal events is a resistance thermometer, a thermocouple or a vacuum meter mentioned hereinabove, it is not limited to any of them, but it is a matter of course that various sensors and so forth can be utilized.

In the superconducting magnet device 100 of the present embodiment, when a temperature rise of the superconducting coil 10 is caused by abnormality of the cryocooler 18 or loss of vacuum of the adiabatic vacuum vessel 22, the signal lines 24 and 29 for transmitting malfunctioning of the cryocooler 18, and the signal line 23 for transmitting a generated voltage by a temperature rise of the superconducting coil 10 or normal conducting transition are used to transmit signals representing them to the driving circuit 15. In other words, the signal lines are signal inputting means to the driving circuit 15.

If the driving circuit 15 receives any of the signals transmitted from the signal lines 23, 24 and 29, then it transmits a signal to the pulse power supply 16a connected in parallel to the persistent current switch 11 to output current. If the pulse power supply 16a is driven, then the sum current of supply current $I_p$ originating from the pulse power supply 16a and rated current $I_{op}$ flowing through the superconducting coil 10 flows into the persistent current switch 11. It is to be noted that the pulse power supply 16a outputs the supply current $I_p$ so as to flow in the same direction as that of the rated current $I_{op}$ and besides supplies the supply current $I_p$ such that the sum current of the supply current $I_p$ and the rated current $I_{op}$ exceeds the superconducting critical current of the persistent current switch 11. Accordingly, the pulse power supply 16a can be regarded as a current source which supplies current of a polarity different from that of the power supply 14 for excitation to be utilized when the superconducting coil 10 is to be energized.

Further, in the superconducting magnet device 100, the driving circuit 15 drives the heater power supply 12 to cause the heater 17 to generate heat together with the supply of the supply current $I_p$. The heat generation of the heater 17 may be continued until the energization current of the superconducting coil 10 is attenuated. By causing the heater 17 to generate heat over a fixed period of time, such a situation that the persistent current switch 11 which has transited to normal conduction by supply of the supply current $I_p$ outputted from the pulse power supply 16a transits to a superconducting state again can be prevented.

This is because, since the persistent current switch 11 is connected to the cryocooler 18 through the good conductor 21, even if transition to a normal conducting state occurs once by supply of the supply current $I_p$, depending upon the cooling capacity of the cryocooler 18, there is the possibility that the persistent current switch 11 may be cooled by more than the heat amount generated by normal conducting transition and return to the superconducting state. By causing the driving circuit 15 to drive the heater power supply 12 to cause the heater 17 to generate heat together with supply of the supply current $I_p$, it is possible to stop the superconducting magnet device 100 with a higher degree of certainty.

In the superconducting magnet device 100 of the present embodiment described as above, when the persistent current switch 11 transits to normal conduction, the transition from the persistent current operation mode to the stopping mode advances in the following manner. If some abnormality occurs with the superconducting magnet device 100 or an external environment, then signals are inputted to the driving circuit 15 through the individual signal lines. The driving circuit 15 receiving the inputs outputs a signal for activating the pulse power supply 16a, and the pulse power supply 16a receiving the signal outputs current which flows in the same direction as that of current flowing already through the persistent current switch 11, namely, as that of current flowing to the superconducting coil 10.

Since current of the sum of the supply current $I_p$ and the rated current $I_{op}$ flows to the persistent current switch 11, the sum current exceeds the critical current and the persistent current switch 11 transits to normal conduction. By this normal conducting transition, resistance $R_s$ appears with the persistent current switch 11, and thereafter, the magnetic energy accumulated in the superconducting coil 10 decreases in accordance with a time constant of $L(R_s+R)/R_sR$.

Here, for example, if the heat generation of the heater 17 is 1 W and the heat capacity from an operation temperature to a temperature, at which normal conducting transition occurs, of the persistent current switch 11 in the persistent current operation mode is C, then only when heat is generated only by the heater 17, the time period after operation of the persistent current switch driving circuit 15 until normal conducting transition of the persistent current switch 11 occurs is C seconds.

Meanwhile, in the present embodiment, the required time period till normal conducting transition includes only a period of time within which the pulse power supply 16a is driven and is substantially 0 seconds. Accordingly, with the superconducting magnet device 100 of the present embodiment, it is possible to allow the persistent current switch to transit to a normal conducting state at a speed several times that in the conventional case in which only heat generation of a heater is involved.

This has a significant meaning to a persistent current switch in which a high-temperature superconducting conductor is used. This is because the high-temperature superconducting conductor has a great heat capacity until a normal conducting transition temperature is reached from an operation temperature in a persistent current operation mode and time is required for starting of magnetic energy expenditure. That the period of time till starting of magnetic energy expenditure is elongated signifies that, for example, even in a case in which some abnormality occurs with the superconducting coil, magnetic energy which does not attenuate acts upon the superconducting coil, and such a load as may damage the superconducting coil may be generated.

However, since the superconducting magnet device 100 of the present embodiment includes a mechanism for supplying, to the persistent current switch 11 in the persistent current operation mode, such current as exceeds the critical current of the persistent current switch 11 when some abnormality occurs, it is possible to cause normal conducting transition to occur rapidly before such an overload as described above is generated thereby to expend the magnetic energy. Therefore, it is possible to improve the soundness of the superconducting magnet device.

Embodiment 2

In the present embodiment, an example of a superconducting magnet device is described in which a circuit for supplying current to the persistent current switch 11 during persistent current operation is accommodated in the adiabatic vacuum vessel 22.

Figure 3:
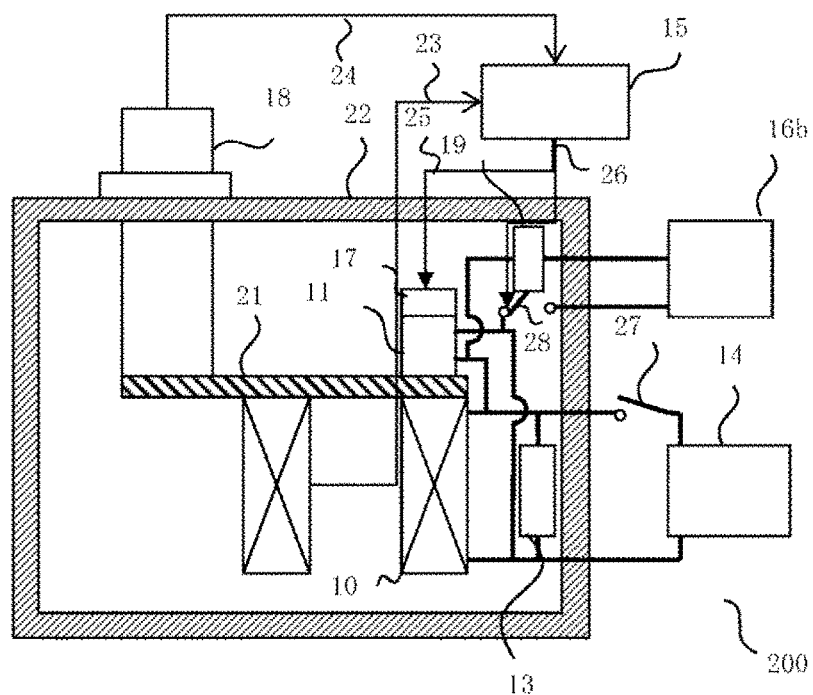
FIG. 3 is a block diagram of a superconducting magnet device according to embodiment 2 of the present invention.

FIG. 3 is an example of a block diagram depicting a superconducting magnet device 200 in embodiment 2.

Description of elements of the superconducting magnet device 200 of FIG. 3 which have same functions as those of the components to which like reference characters to those depicted in FIG. 1 described hereinabove are applied is omitted.

In the superconducting magnet device 200, a capacitor 19 is accommodated in the adiabatic vacuum vessel 22. The driving circuit 15 is connected to a changeover switch 28.

A DC power supply 16b is connected, during excitation of the superconducting coil 10, to the capacitor 19 such that the capacitor 19 is charged. When the superconducting magnet device 200 is operating in a persistent current mode, the DC power supply 16b is disconnected from the capacitor 19. By the disconnection, intrusion heat to the adiabatic vacuum vessel 22 decreases, and the stability of operation of the superconducting magnet device 200 can be raised.

Figure 4:
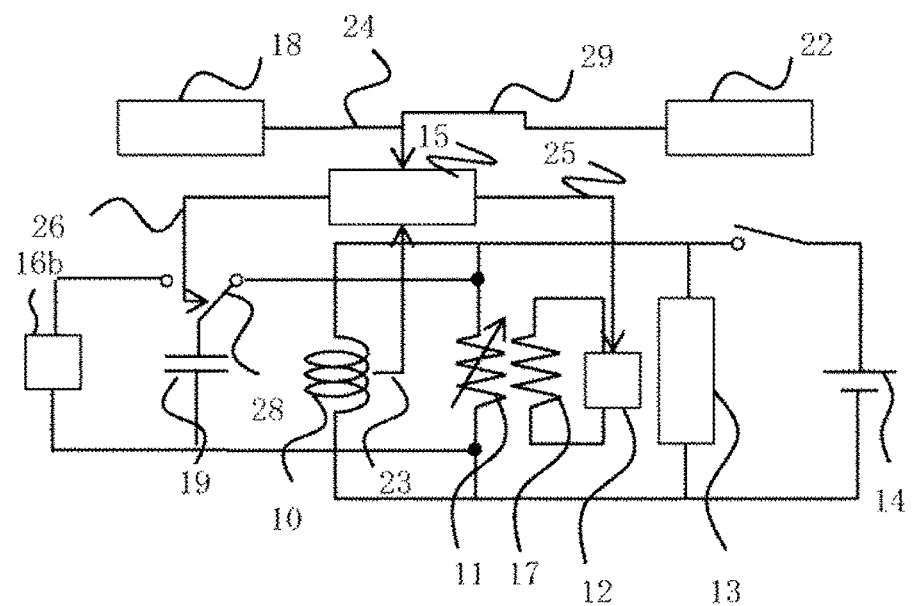
FIG. 4 is a circuit diagram of the superconducting magnet device according to embodiment 2 of the present invention.

FIG. 4 depicts an example of an equivalent circuit diagram of the superconducting magnet device 200 in the present embodiment when charge charged in the capacitor 19 is discharged.

When a temperature rise of the superconducting coil 10 by degradation of the degree of vacuum in the freezer 18 or the adiabatic vacuum vessel 22 occurs and the cryocooler 18 suffers from malfunctioning, signals indicative of such abnormalities are brought to the driving circuit 15 through the signal line 24, signal line 29 and signal line 23. The driving circuit 15 receiving the signals changes over the changeover switch 28 such that charge accumulated in the capacitor 19 is charged as current into the persistent current switch 11. Here, if the capacitance of the capacitor 19 is set such that the sum with rated current exceeds critical current, then upon discharge of the capacitor 19, current exceeding the critical current is supplied to the persistent current switch 11. Thereupon, the persistent current switch 11 transits to normal conduction, and then the normal conducting transition is maintained by heat generation of the heater 17 operated by the driving circuit 15. Consequently, the superconducting magnet device 200 quickly expends the magnetic energy and can transit from the persistent current operation mode to the stopping mode while soundness of the apparatus is maintained.

Embodiment 3

In the present embodiment, an example of a superconducting magnet device wherein current to the persistent current switch 11 is supplied and an elastic body for operating the heat transfer path to the cryocooler is provided is described.

Figure 5:
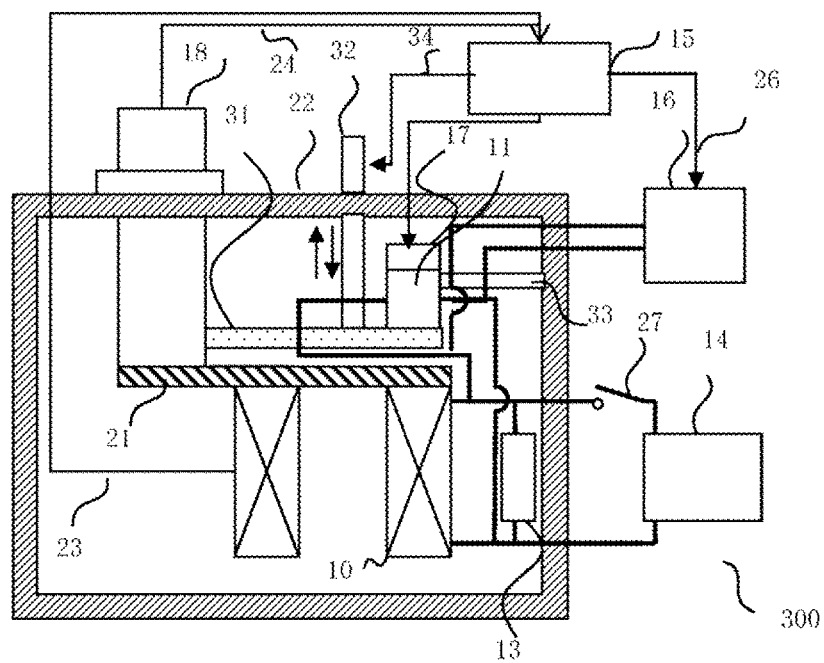
FIG. 5 is a block diagram of a superconducting magnet device according to embodiment 3 of the present invention.

FIG. 5 is an example of a block diagram depicting a superconducting magnet device 300 according to embodiment 3.

Description of elements of the superconducting magnet device 300 of FIG. 5 which have same functions as those of the components to which like reference characters to those depicted in FIG. 1 described hereinabove are applied is omitted.

In the present embodiment, the persistent current switch 11 is connected by a load support 33 and contacts with the cryocooler 18 through a good conductor 31 different from the superconducting coil 10. The position of the good conductor 31 is operated by an elastic body 32.

If a temperature rise of the superconducting coil 10 is caused by some abnormality of the cryocooler 18 or degradation of the degree of vacuum of the adiabatic vacuum vessel 22, then the signal line 24 which indicates malfunctioning of the cryocooler, the signal line 29 or the signal line 23 which indicates a generated voltage by a temperature rise or normal conducting transition of the superconducting coil are used to bring signals representing them to the driving circuit 15.

The driving circuit 15 sends a signal to a driving mechanism (not depicted) for the elastic body 32 through a signal line 34 to control the driving mechanism such that the good conductor 31 is spaced away from the good conductor 21. As a result, since the good conductor 31 and the persistent current switch 11 are physically spaced away from each other, the heat transfer path to the persistent current switch 11 is reduced. In other words, when an abnormality occurs, by spacing the good conductor 21 connected to the cryocooler 18 and the good conductor 31 connected to the persistent current switch 11 away from each other, the persistent current switch 11 is not acted upon by cooling of the cryocooler 18 to decrease the absorption amount of heat thereby to suppress the persistent current switch 11 from entering a superconducting state again after pulse current is supplied. With the present embodiment, since resistance heat which may possibly be generated by normal conducting transition is not absorbed by the cryocooler 18 after current exceeding the critical current is supplied to the persistent current switch 11, return to the superconducting state is less likely to occur, and the soundness of the superconducting magnet device 300 is raised.

Embodiment 4

In the present embodiment, not only a superconducting magnet device by conduction cooling using a cryocooler but also an example of a superconducting magnet device cooled using liquid coolant are described.

Figure 6:
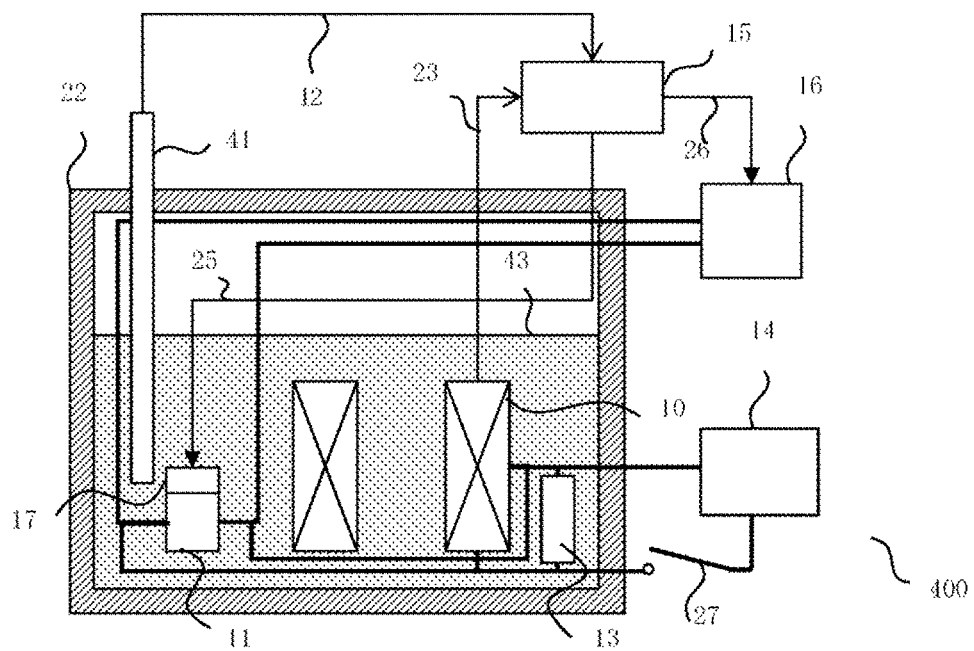
FIG. 6 is a block diagram of a superconducting magnet device according to embodiment 4 of the present invention.

FIG. 6 is an example of a block diagram depicting a superconducting magnet device 400 according to embodiment 4.

Description of elements of the superconducting magnet device 400 of FIG. 6 which have same functions as those of the components to which like reference characters to those depicted in FIG. 1 described hereinabove are applied is omitted.

The superconducting coil 10 and the persistent current switch 11 accommodated in the adiabatic vacuum vessel 22 are dipped in coolant 43 in the form of liquid, and a level gauge 41 which is a measuring element for measuring the amount of the coolant 43 is provided for the adiabatic vacuum vessel 22. The coolant 43 in the form of liquid is, for example, liquid helium, liquid neon, liquid hydrogen or liquid nitrogen. From current flowing through a signal line 42 when the level gauge 41 indicates an amount equal to or smaller than required remaining amount or current flowing through the signal line 23 when the superconducting coil 10 generates a voltage corresponding to that upon normal conducting transition, a signal for driving a current supplying source 16 and the heater 17 is inputted to the persistent current switch 11 and to the persistent current switch driving circuit 15.

DESCRIPTION OF REFERENCE CHARACTERS 100, 200, 300, 400: Superconducting magnet devices
10: Superconducting coil
11: Persistent current switch
12: Heater power supply
13: Protection circuit
14: Power supply for excitation
15: Persistent current switch driving circuit
16: Current supplying source to persistent current switch
16a: Pulse power supply
16b: DC power supply
17: Heater
18: Cryocooler
19: Capacitor
21, 31: Good conductors
22: Adiabatic vacuum vessel
23, 24, 25, 26, 29, 34, 42: Signal lines
27, 28: Switches
32: Elastic body
33: Load support
41: Level gauge
43: Coolant

The invention claimed is:

1. A superconducting magnet device, comprising:
    a superconducting coil connected to a power supply for excitation;
    a persistent current switch connected to the superconducting coil;
    a heater configured to control a temperature of the persistent current switch;
    a current source connected in parallel to the persistent current switch and having a polarity different from that of the power supply for excitation;
    a driving circuit connected to the heater and the current source; and
    signal inputting means for inputting a signal to the driving circuit; wherein
    the driving circuit renders the heater and the current source operative when the signal is inputted thereto.

2. The superconducting magnet device according to claim 1, further comprising:
    a good conductor contacting with the superconducting coil; and
    a refrigerator connected to the good conductor.

3. The superconducting magnet device according to claim 1, further comprising:
    abnormality detection means disposed for the superconducting coil; wherein
    the abnormality detection means is connected to the signal inputting means.

4. The superconducting magnet device according to claim 2, further comprising:

a driving mechanism provided at part or the entirety of the good conductor connected to the refrigerator; wherein
the good conductor and the refrigerator are separable from each other.

5. The superconducting magnet device according to claim 1, wherein
the superconducting coil or the persistent current switch is cooled by coolant.

6. The superconducting magnet device according to claim 5, further comprising:
a measuring element configured to measure a coolant amount of the coolant.

\* \* \* \* \*